(12) United States Patent
McCord

(10) Patent No.: US 6,927,591 B2
(45) Date of Patent: *Aug. 9, 2005

(54) METHOD AND SYSTEM FOR WAFER AND DEVICE LEVEL TESTING OF AN INTEGRATED CIRCUIT

(76) Inventor: Don McCord, 4448 Eck La., Austin, TX (US) 78734

(*) Notice: Subject to any disclaimer, the term of this patent is extended or adjusted under 35 U.S.C. 154(b) by 0 days.

This patent is subject to a terminal disclaimer.

(21) Appl. No.: 10/130,842
(22) PCT Filed: Sep. 24, 2001
(86) PCT No.: PCT/US01/42264
§ 371 (c)(1), (2), (4) Date: May 21, 2002
(87) PCT Pub. No.: WO02/25296
PCT Pub. Date: Mar. 28, 2002

(65) Prior Publication Data
US 2003/0076125 A1 Apr. 24, 2003

Related U.S. Application Data
(60) Provisional application No. 60/234,647, filed on Sep. 22, 2000.

(51) Int. Cl.[7] .............................................. G01R 31/26
(52) U.S. Cl. ....................................... 324/765; 702/117
(58) Field of Search ............................... 324/73.1, 754, 324/761–763, 765, 768–769, 158.1; 702/117–118, 120, 124; 714/700, 733–734

(56) References Cited

U.S. PATENT DOCUMENTS

| | | | |
|---|---|---|---|
| 4,342,958 A | * | 8/1982 | Russell ........................ 324/754 |
| 5,325,053 A | | 6/1994 | Gasbarro et al. |
| 5,748,006 A | | 5/1998 | Sano |
| 6,019,639 A | | 2/2000 | Brunker et al. |
| 6,218,910 B1 | | 4/2001 | Miller |
| 6,236,572 B1 | | 5/2001 | Teshome et al. |
| 6,339,338 B1 | * | 1/2002 | Eldridge et al. ............ 324/765 |
| 6,501,343 B2 | | 12/2002 | Miller |
| 6,587,896 B1 | | 7/2003 | Baldwin et al. |
| 6,622,103 B1 | * | 9/2003 | Miller ........................... 702/89 |
| 2001/0034865 A1 | | 10/2001 | Park et al. |
| 2002/0074653 A1 | | 6/2002 | Khandros et al. |
| 2002/0175697 A1 | | 11/2002 | Miller |
| 2003/0006856 A1 | | 1/2003 | Miller |

FOREIGN PATENT DOCUMENTS

| | | |
|---|---|---|
| WO | WO 00/13186 A1 | 3/2000 |
| WO | WO 01/35110 A1 | 5/2001 |
| WO | WO 01/63311 A3 | 8/2001 |
| WO | WO 01/63311 A2 | 8/2001 |

OTHER PUBLICATIONS

Gasbarro, J.A.; Horowitz, M.A.; Rambus Inc.; *Techniques for Characterizing Drams with a 500 MHZ Interface*, Proceedings of the International Test Conference, US, New York, IEEE, Oct. 2, 1994, pp. 516–525.

Goldberg, J.M.; *Timing: The Key to Rambus Testing*, Test and Measurement World, US, Cahners Publishing, Denver, vol. 17, No. 11, Oct. 1, 1997, pp. 53–54, 56, 58–29.

Ho, C.C.; *Defining Tomorrow's Memory Module Tester*, E E: Evaluation Engineering, vol. 38, No. 3, Mar. 1999, pp. 14–18.

Pointl, Peter; *Interfacing, Often a Performance Bottleneck Between Ate and Device Under Test*, Computer Society Press, 1st European Test Conference, Apr. 1989, pp. 94–99.

* cited by examiner

*Primary Examiner*—Minh N. Tang
(74) *Attorney, Agent, or Firm*—Brian F. Russell; Dillon & Yudell LLP

(57) ABSTRACT

A tester comprises test logic and a connector for at least one device under test. The connector, which may comprise a wafer probe for dice on a wafer or a test fixture or either packaged integrated circuit devices or circuit board modules, has connections for the device under test that present an impedance selected to emulate the characteristic impedance of an end-use environment of the device under test. For example, in an embodiment in which the device under test comprises DDR memory and the end-use environment is a DDR memory module, the characteristic impedance is approximately 60 ohms. Because this accurate simulation is available even for dice on a wafer, the needless expense associated with packaging defective dies and assembling defective dies into modules can be avoided.

59 Claims, 12 Drawing Sheets

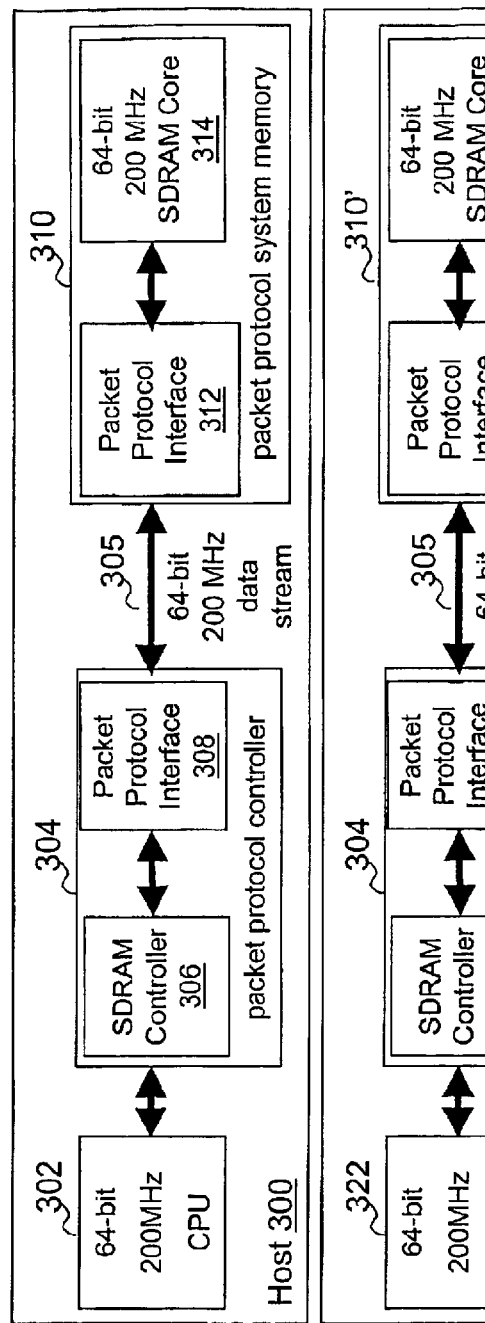
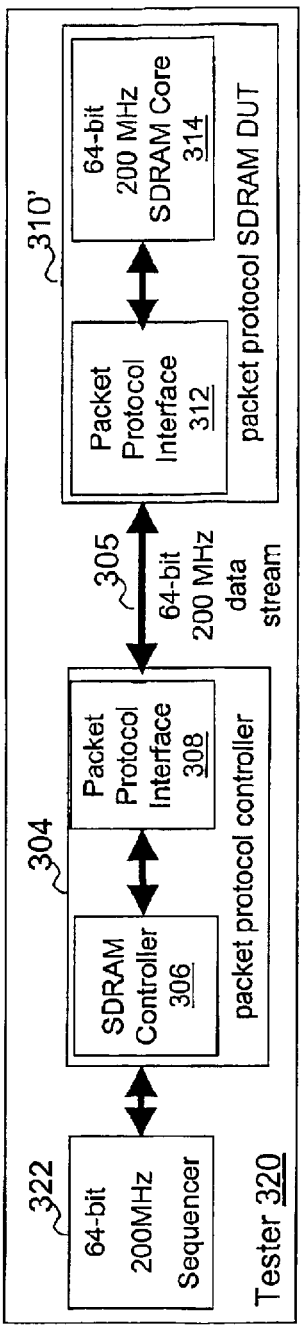
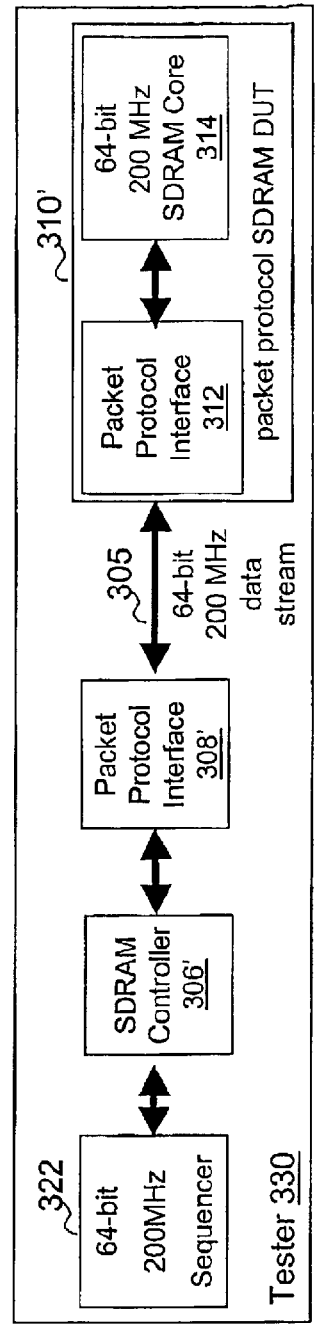
Figure 9A
Figure 9B
Figure 9C

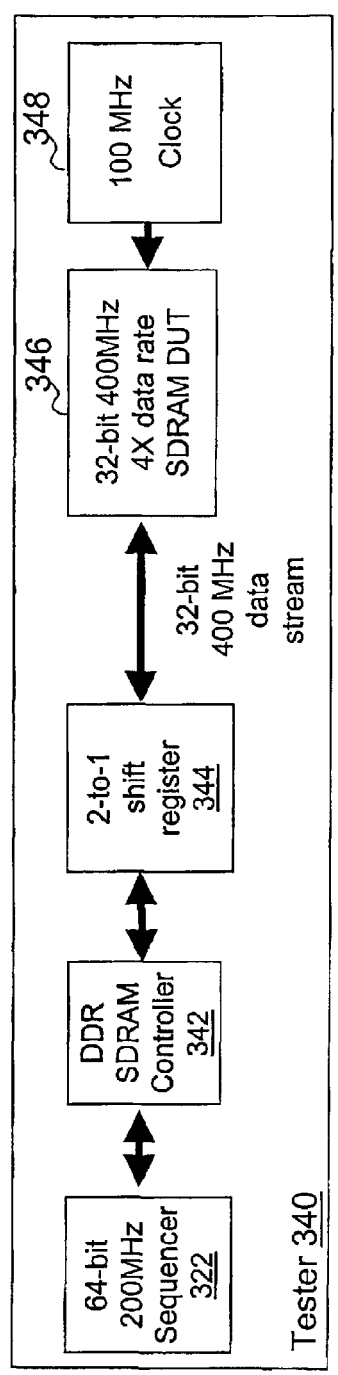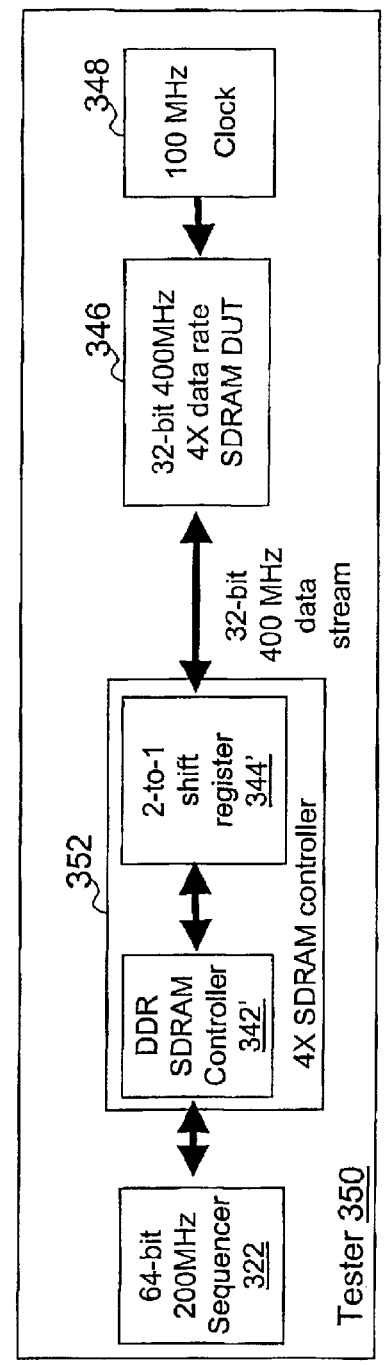
Figure 10A
Figure 10B

METHOD AND SYSTEM FOR WAFER AND DEVICE LEVEL TESTING OF AN INTEGRATED CIRCUIT

This national stage application claims the benefit of U.S. Provisional Application No. 60/234,647, filed on 22 Sep. 2000, and entitled "Method and System for Wafer and Device-Level Testing of an Integrated Circuit."

BACKGROUND OF THE INVENTION

1. Technical Field

The present invention relates in general to testing electronic devices and, in particular, to testing integrated circuits. Still more particularly, the present invention relates to a method and system for wafer and device-level testing of integrated circuits such as memories.

2. Description of the Related Art

Integrated circuit memories, such as dynamic random access memories (DRAMs), are nearly universally utilized to provide data storage in electronic systems, such as computer systems. To ensure proper operation of the electronic systems, the manufacturing process for integrated circuit memories includes a number of testing steps intended to verify that the integrated circuit memories will provide reliable performance over the expected lifetime of the electronic systems in which they are installed.

A typical manufacturing process for DRAMs begins with the fabrication of a semiconductor wafer containing hundreds or even thousands of identical dice that each include integrated memory circuitry. The integrated memory circuitry in each die generally includes a memory array for storing data and may include interface circuitry for accessing the memory array and performing other operations in response to memory requests or commands.

Following wafer fabrication, a quick first pass wafer probe is performed in an attempt to identify dies on the wafer having defects. The first pass wafer probe, which is conventionally performed utilizing clock, address and data signals having lower than normal operating frequencies, writes and reads some or all memory locations to identify defective rows and columns in the memory array.

Because memory array defects are not uncommon, a typical DRAM die is fabricated with one or more redundant rows and columns that can be activated in place of defective rows and columns by redundancy fusing. Thus, if any defects are detected during the first pass wafer probe, redundancy fusing is performed (e.g., by application of high voltage or lasing) to repair the defects. Once any such redundancy fusing has been performed, the wafer is subjected to a second pass wafer probe to determine the efficacy of fusing in addressing detected defects, and any dies failing the second pass wafer probe are marked as faulty.

Following the second pass wafer probe, the wafer is scribed into dice. Dice marked as faulty after the wafer probes are discarded, and dice passing the wafer probes are packaged to obtain DRAM devices. Packaging technologies that are commonly used for DRAMs include, among others, ball grid array (BGA) and wire bond.

After packaging, the packaged DRAMs are subjected to device-level testing. Device-level testing, like the wafer probe tests, may include low frequency tests of the DRAM array. Device-level testing may also include a "burn-in" test in which the packaged DRAMs under test are subjected to high ambient temperatures and tests of long duration in order to discover early life failures. Device-level testing also differs from wafer probe testing in that, in addition to basic pattern testing of memory arrays, device-level testing generally tests the DC and AC characteristics of the packaged DRAMs and the logic and operation of the memory interface. Device-level testing also differs from wafer probe testing in that device-level testing is typically performed at or near the rated signal frequencies of the packaged DRAM, which generally requires more sophisticated and expensive test equipment.

Packaged DRAMs that pass the device-level test may subsequently be assembled together on circuit cards to form memory modules such as SIMMs (single in-line memory modules) and DIMMs (dual in-line memory modules). Each memory module is then typically subjected to a final, intensive fault test prior to shipping or installation. The faults detected by module testing include faults in the circuit cards themselves (e.g., open or shorted traces), faults introduced by module assembly (e.g., damaged pin drivers, open or shorted pins, and ESD damage), and undetected faults in the DRAM circuitry. Following completion of testing, DRAM devices and modules that pass can then be installed in an end-use application.

One drawback of the conventional DRAM manufacturing process outlined above is that a number of faults are not discovered until late in the manufacturing process, for example, during device-level and module testing. As appreciated by the present invention, if such defects could be detected earlier in the manufacturing process (i.e., during wafer testing), the significant expense associated with packaging and module assembly of the defective dice could be eliminated. Unfortunately, the expense of the sophisticated test equipment currently required to fully exercise integrated memory circuitry prohibits its use during wafer testing.

A second drawback of the conventional manufacturing process is that several different pieces of specialized test equipment are required to fully test many integrated circuits. For example, to test the memory array of a DRAM, an algorithmic tester is utilized to write a predetermined data pattern into the memory array, read out the contents of the memory array, and then compare the output data with the original data pattern. A separate vector tester is utilized to exercise the memory's internal test logic, such as that defined in the IEEE 1149.1 standard. A third system tester is also employed to verify proper operation of the DRAM in response to commands. As will be appreciated, the use of multiple testers compounds the expense of testing.

A third drawback of the prior art is that conventional test equipment does not fully emulate the intended end-use environment of devices under test. In particular, conventional testers for packaged DRAM devices and modules have a fixed input impedance. This input impedance cannot be adjusted and may result in test behavior that is quite different from the operating behavior of the DRAM device under test when it is eventually installed in an end-use environment. Consequently, there may be an unacceptably high number of faulty devices or modules that pass the test process and even some satisfactory devices that fail the test process.

SUMMARY OF THE INVENTION

The present invention overcomes the foregoing and additional shortcomings in the prior art by introducing an improved method and system for wafer and device-level testing of integrated circuits such as integrated circuit memories.

According to a preferred embodiment of the present invention, a tester comprises test logic and a connector for at least one device under test. The connector, which may comprise a wafer probe for dice on a wafer or a test fixture for packaged integrated circuit devices, has connections for the device under test that present an impedance selected to emulate the characteristic impedance of an end-use environment of the device under test. For example, in an embodiment in which the device under test comprises DDR memory and the end-use environment is a DDR memory module, the characteristic impedance is between approximately 54 and 66 ohms. Thus, the tester of the present invention can accurately simulate operational behavior in an end-use environment of the device under test. Because this accurate simulation is available even for dice on a wafer, the needless expense associated with packaging defective dies and assembling defective dies into modules can be avoided.

The test logic, which is coupled to the connector for communication with the device under test, transfers test commands and test data to the device under test. The test data and commands are utilized to perform multiples types of tests, including tests of the core logic and interface logic of the device under test. In this manner, the need for multiple types of testers is reduced or eliminated.

Additional objects, features, and advantages of the present invention will become apparent from the following detailed written description.

BRIEF DESCRIPTION OF THE DRAWINGS

The novel features believed characteristic of the invention are set forth in the appended claims. The invention itself however, as well as a preferred mode of use, further objects and advantages thereof, will best be understood by reference to the following detailed description of an illustrative embodiment when read in conjunction with the accompanying drawings, wherein:

FIG. 9A illustrates a host system having a memory architecture that employs a packet bus interface, rather than a conventional master/slave interface;

FIG. 9B depicts an exemplary memory tester for testing a device under test (DUT) having a packet protocol interface;

FIG. 9C illustrates an alternative embodiment of a memory tester for testing a device under test (DUT) having a packet protocol interface;

FIG. 10A depicts an exemplary memory tester that employs a shift register to permit testing of a memory DUT that supports transfers at more than twice the clock rate;

FIG. 10B illustrates an alternative embodiment of a memory tester having a memory controller including a shift register that permits testing of a memory DUT that supports transfers at more than twice the clock rate;

DETAILED DESCRIPTION OF A PREFERRED EMBODIMENT

Figure 1:
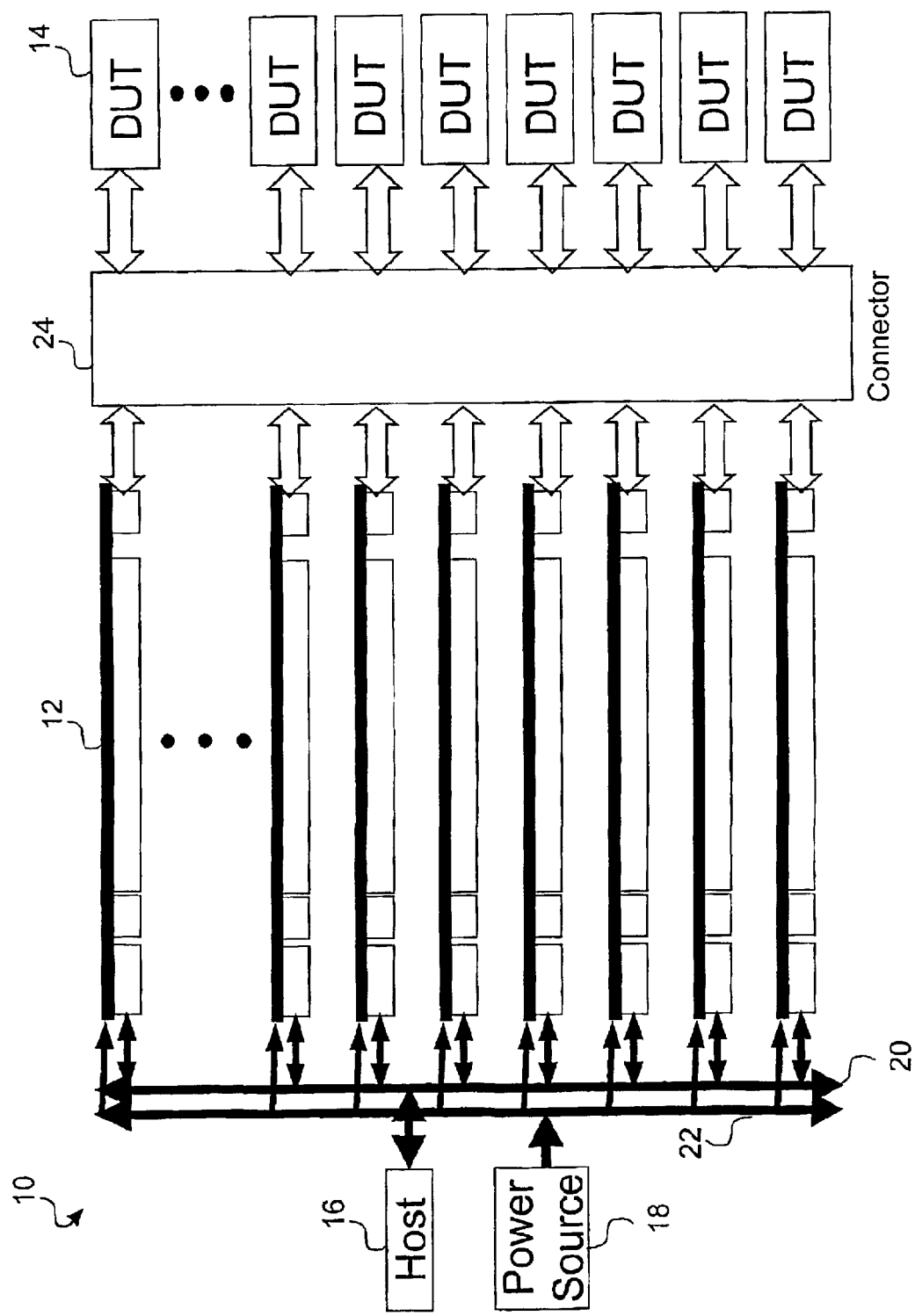
FIG. 1 is a high-level block diagram of a memory tester in accordance with a preferred embodiment of the present invention.

With reference now to the figures and in particular with reference to FIG. 1, there is depicted a high-level block diagram of an illustrative embodiment of a memory tester in accordance with the present invention. As illustrated, memory tester 10 includes one or more (e.g., 64) tester logic boards 12 that each includes circuitry for testing one device under test 14. In the context of the present invention, a "device under test" (DUT) is defined as either a die on a semiconductor wafer, a packaged integrated circuit device, or a memory module.

Each tester logic board 12 is coupled to a host 16 and a power source 18 (e.g., 110 V AC) via a communication bus 20 and a power bus 22, respectively. Host 16, which may be a suitably programmed personal computer or a control processor, downloads test procedures and test parameters to and receives test results from tester logic boards 12 via communication bus 20.

As further illustrated in FIG. 1, each tester logic board 12 is coupled to a respective DUT 14 by a controlled impedance connector 24 having connection elements suitable for the type of DUT 14 being tested. Thus, if DUTs 14 are memory dice on a wafer, connector 24 comprises a wafer probe; if, however, DUTs 14 are packaged memory devices, connector 24 comprises a test fixture having sites for connecting to packaged memory devices. For flexibility, tester logic boards 12 preferably employ a "universal" interface that can support either type of connectors 24. Importantly, and as discussed further below, the connection elements of connector 24 present to each DUT 14 a characteristic impedance that is selected to simulate an end-use environment of DUTs 14.

Figure 2:
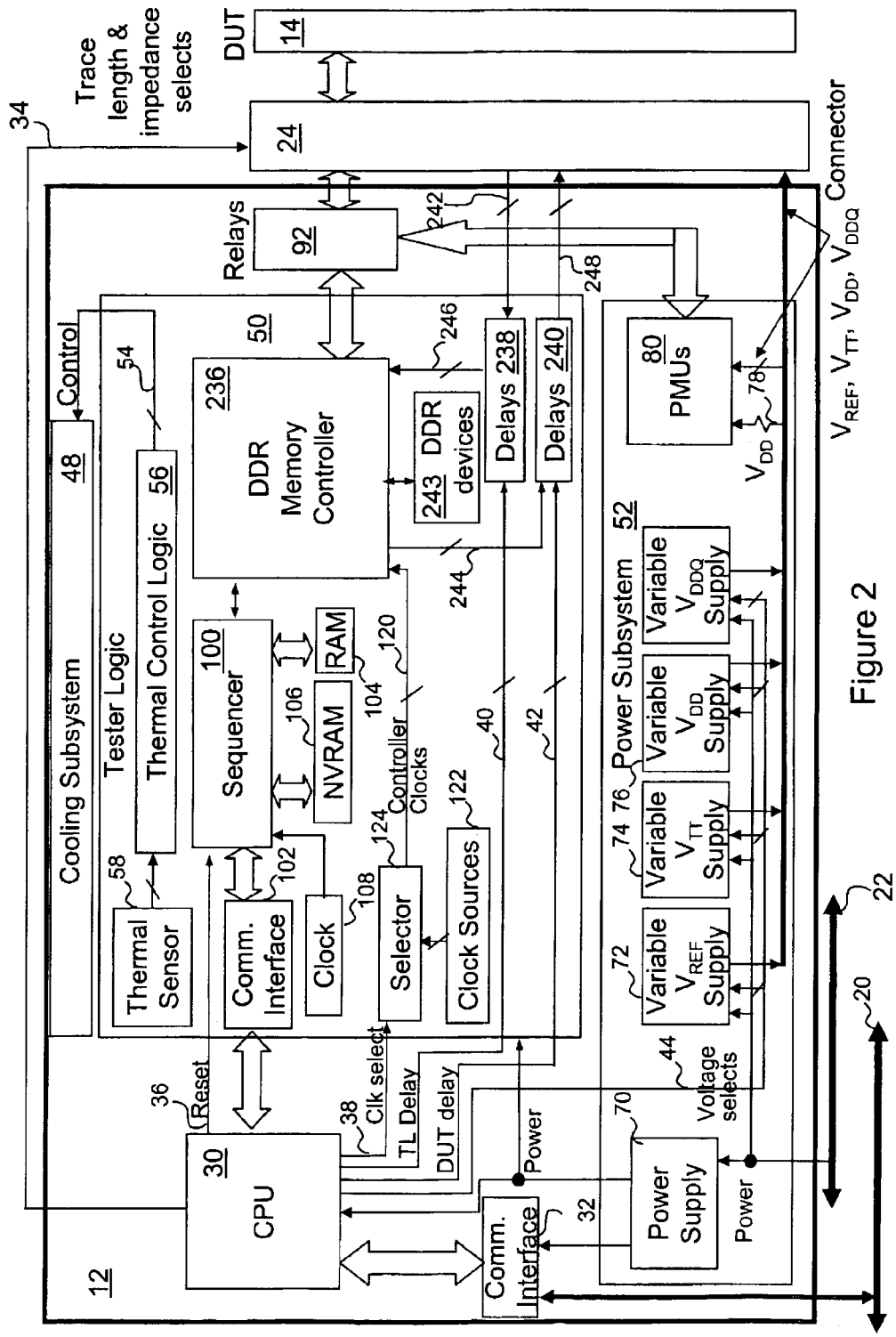
FIG. 2 is a more detailed block diagram of a tester logic card in the memory tester illustrated in FIG. 1.

Referring now to FIG. 2, there is illustrated a more detailed block diagram of a tester logic board 12 from FIG. 1 in accordance with a preferred embodiment of the present invention. The depicted embodiment includes circuitry specifically designed for testing DDR dynamic random access memory (DRAM) either on wafer, as packaged devices, or as memory modules; however, those skilled in the art will appreciate that the present invention is not limited to DDR DRAM testing, but is instead applicable to testing other types of integrated circuitry. References useful for an understanding of the depicted embodiment of the present invention include the following DDR documentation (which is incorporated herein by reference):

a) JEDEC standard No. 21-C: 4.5.10—184 PIN UNBUFFERED DDR SDRAM DIMM FAMILY;

b) JEDEC standard JESD79: Double Data Rate (DDR) SDRAM Specification;

a) Hyundai Electronics Industries Data Sheet: HYMD1327258-K/H/L 32 M×72 Unbuffered DDR SDRAM DIMM b) Hyundai Electronics Industries Data Sheet: HYMD132G7258-K/H/L 32 M×72 Registered DDR SDRAM DIMM c) Hyundai Electronics Industries Data Sheet: 4 Banks× 8/4/2 M×4/8/16 bits DDR SDRAM d) Hyundai Electronics Industries Data Sheet: 128 M DDR SDRAM e) Micron Technology Design Specification: Revision 0.9, DDR SDRAM Unbuffered DIMM f) Micron Technology Data Sheet: 16, 32 MEG×72 DDR Registered SDRAM DIMMs g) Micron Technology Data Sheet: MT46V64M4—16 Meg×4×4 banks and MT46V32M8—8 Meg×8×4 banks h) Micron Technology Data Sheet: MT46V16M16 Double Data Rate SDRAM i) NEC Data Sheet: PD45D160442, 45D160842, 45D160164 160 M-bit Synchronous DRAM with Double Data Rate j) Fairchild Semiconductor Data Sheet: FMS7857 Phase Locked Loop Clock Driver k) Fairchild Semiconductor Data Sheet: SSTV16857 14-Bit Register with SSTL-2 Compatible I/O and Reset l) Fairchild Semiconductor Data Sheet: FM34W02 2K-Bit JEDEC standard 2-Wire Bus Interface Serial EEPROM m) Xilinx Inc. Data Sheet: Virtex™-E 1.8 volt Field Programmable Gate Arrays;

n) Xilinx Inc. Data Sheet: Virtex™ 2.5 volt Field Programmable Gate Arrays;

o) Xilinx Inc. Application Note: Virtex Series and Spartan-II Family: Synthesizable 1.6 GBytes/s DDR SDRAM Controller; and p) Intel Data Sheet: Pentium III Processor for the PGA370 Socket at 500 MHz to 1.0B GHz.

As shown, each tester logic board 12 includes a central processing unit (CPU) 30 that controls the testing performed by that tester logic board 12. CPU 30 receives test procedures, test parameters, test data and expected test results from host 16 via communication bus 20 and communication interface 32. Based upon these inputs, CPU 30 generates a number of output signals 34–44 (described further below) to orchestrate the operation of the other components of tester logic board 12 during testing.

In addition to CPU 30, tester logic board 12 includes at least three principal subsystems: cooling subsystem 48, tester logic 50 and power subsystem 52. Cooling subsystem 48, which may comprise, for example, a convection or thermoelectric cooling system, dissipates heat produced by the components of tester logic board 12. The operation of cooling subsystem 48 is actively controlled by cooling control signals generated by thermal control logic 56 within tester logic 50 in response to the output of a thermal sensor 58.

Power subsystem 52 includes a power supply 70 that utilizes power received from power bus 22 to provide power with the appropriate voltage and current characteristics to CPU 30, communication interface 32, and tester logic 50. Power subsystem 52 further includes a number of variable voltage supplies 72–78 that provide voltages utilized to operate DUT 14. In the illustrated embodiment, in which tester logic board 12 is designed to test DDR memory, variable power supplies 72–78 include variable reference voltage ($V_{REF}$) supply 72, variable system termination voltage ($V_{TT}$) supply 74, variable $V_{DD}$ supply 76 and variable $V_{DDQ}$ I/O supply 78. Each of variable voltage sources 72–78 outputs a respective selected voltage specified by voltage select signals 44 provided by CPU 30.

Power subsystem 52 finally includes at number of power measurement unit (PMUs) 80, which are selectively coupled to the output pins of DUT 14 by relays 92. Relays 92 can be configured by CPU 30 to route signals present at the output pins of DUT 14 either to tester logic 50 for evaluation of the correctness of their logic states and/or timing or to PMUs 80 for measurement of their DC power characteristics. As described further below, at least one of PMUs 80 measures the source voltage(s) and current supplied to DUT 14 by determining the voltage drop of $V_{DD}$ across a test resistor 90. Other PMUs 80 preferably measure the leakage current of the output pins of DUT 14.

In addition to the thermal sensor 58 and thermal control logic 56 discussed above, tester logic 50 includes a sequencer 100, which may comprise, for example, a general-purpose processor, a plurality of bit-slice (e.g., 4-bit) processors working in concert, or an application-specific integrated circuit (ASIC). Sequencer 100 is coupled to CPU 30 by a communication interface 102 through which sequencer 100 receives test parameters, test data, correct test results, and test procedures, which are stored by sequencer 100 in random access memory (RAM) 104. Sequencer 100 also receives a reset signal 36 that, when asserted by CPU 30, causes sequencer 100 to reset itself to a known stable state by reference to configuration parameters stored within non-volatile random access memory (NVRAM) 106. The operation of sequencer 100 is timed by a clock 108, which may be asynchronous the clocks utilized to operate DUT 14.

Sequencer 100 is further connected to a DDR memory controller 236, which controls DUT 14 through relays 92 and connector 22. The depicted arrangement of sequencer 100, DDR memory controller 236, connector 22 and DUT 114 simulates the memory subsystem of a personal computer system or other end-use environment of DUT 14. That is, sequencer 100, much like the CPU of a computer system, issues commands and requests to DDR memory controller 236, which can be implemented as a conventional complementary metal-oxide-semiconductor (CMOS) memory controller. Memory controller 236, in turn, communicates with DUT 14 the commands and requests output by sequencer 100 and corresponding responses by DUT 14 utilizing conventional CMOS-level signaling. As shown, DDR memory controller 236 may further be coupled to optional DDR memory devices 243, which permit test instructions, test data, and/or test results to be buffered by DDR memory controller 236 before transfer to sequencer 100 for storage in RAM 104. Alternate embodiments may boost performance by using two separate DDR memory controllers, one for DUT 14 and one for DDR memory devices 243, or one DDR memory controller with a buffer for write posting.

During testing, sequencer 100 sets AC test parametrics for DUT 14, initiates READ and WRITE data transfers to and from DUT 14, and issues commands for DUT 14 based upon the test information stored in RAM 104. In response to receipt of test results from DUT 14, sequencer 100 logs the test results in RAM 104 and compares the test results with correct results also stored in RAM 104 to make a pass/fail determination for DUT 14.

As further shown in FIG. 2, communication between DDR memory controller 236 and DUT 14 is synchronized by timing signals based upon controller clocks 120, which are received by DDR memory controller 236. Controller clocks 120 are selected by selector 124 from among a plurality of clock signals generated by clock sources 122 in response to a clock select signal 38 output by CPU 30. The sets of timing signals utilized to synchronize communication with DUT 14 also include data strobe signals during READ operations (DQS) included in DQS signals 242 generated by DUT 14 and data strobe signals during WRITE operations (DQS) included in DQS signals 244 generated by DDR memory controller 236. In order to test the timing sensitivity of DUT 14, DQS signals 242 and 244 are among the signals passed through respective sets of programmable delays 238 and 240, which applies a delay specified by a respective one of tester logic (TL) delay signals 40 and DUT delay signals 42. Delays 238 and 240 each may be implemented, for example, with a Semtech Edge629 delay circuit and associated Semtech Edge693 driver circuit.

Figure 3:
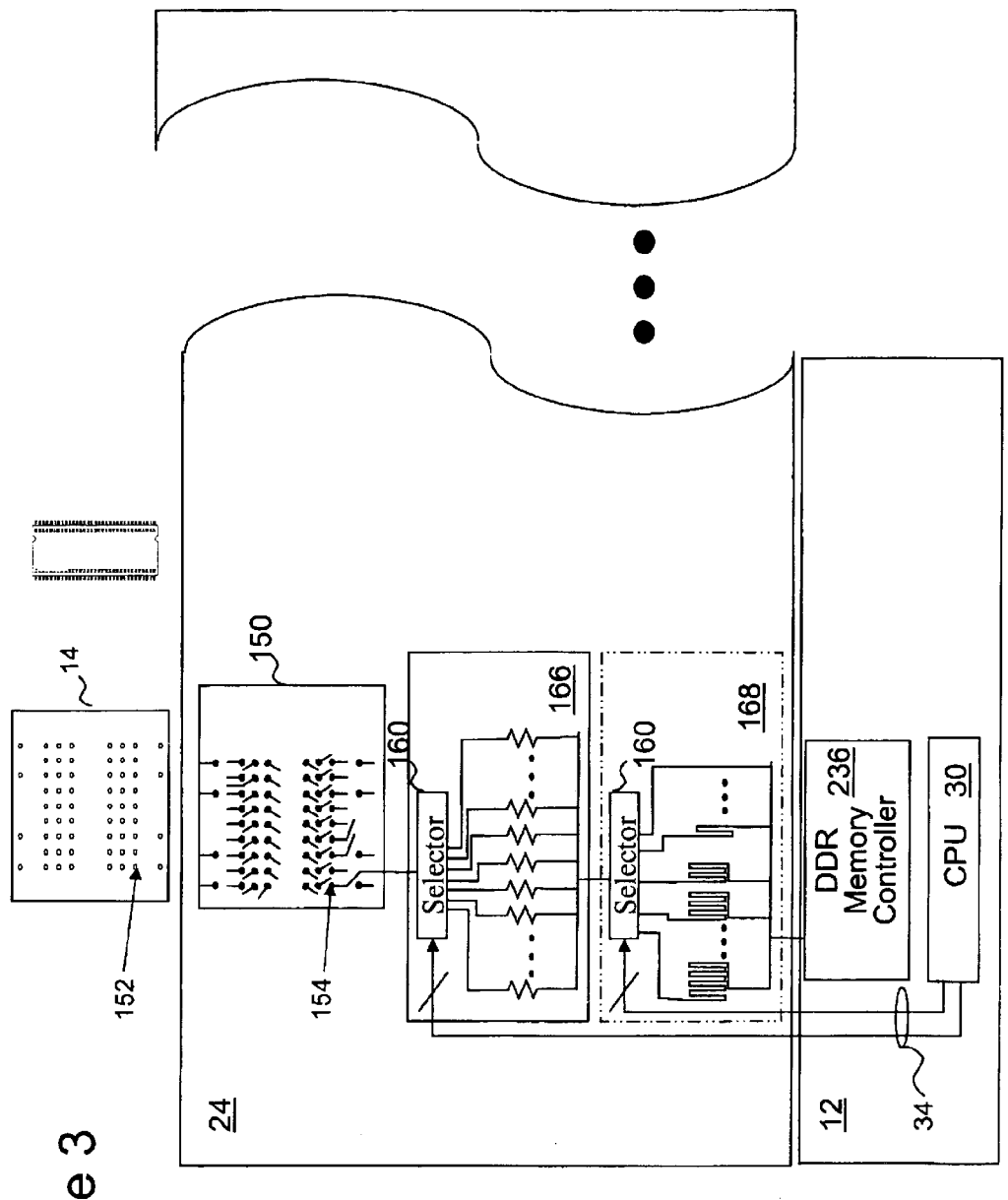
FIG. 3 depicts a portion of a wafer probe or test fixture for packaged devices having selectable impedance and propagation delay in accordance with a preferred embodiment of the present invention.

With reference now to FIG. 3, a detailed depiction of a preferred embodiment of connector 22 from FIGS. 1 and 2 is given. The illustrated embodiment includes a plurality of sites 150 (only one of which is shown), each of which has connections corresponding to the pinout of a DUT 14. For example, the illustrated DUT 14 is a DDR DRAM device packaged in a micro-BGA package having a center-bonded layout of 54 pads 152. Accordingly, site 150 has 54 connections 154, each corresponding to a respective one of pads 152. In a preferred embodiment, each connection 154 comprises a spring contact, such as a Microspring™ interconnection element produced by FormFactor, Inc., of Livermore, Calif.

Between each connection 154 and DDR memory controller 236, a test impedance 166 and an optional propagation delay element 168 are coupled. In accordance with an important aspect of the present invention, the input impedance presented by each connection 154 of site 150, which is test impedance 166, is equivalent to the characteristic impedance of an end-use environment of DUT 14. For example, if the end-use environment is a DDR memory bus, such as a Dual IN-line Memory Module (DIMM) or Small Outline DIMM (SO-DIM), the characteristic impedance is selected to be approximately 60 Ω, and more particularly, 60 Ω±10 Ω. As shown, in a preferred embodiment, multiple end-use environments can be emulated and non-standard impedances outside of specified tolerances can be supported by implementing test impedance 166 as variable impedance. In this preferred embodiment, a respective selector 160 selects a test impedance 166 from among a plurality of different impedances in response to select signals 34 provided by CPU 30.

Optional propagation delay element 168 can be employed to test the timing sensitivity of DUT 14 to various propagation delays that result, for example, from different installation locations of DUT 14 on the DDR memory bus. As illustrated, the operational effects of introducing various different propagation delays into the signal path between connector 154 and DDR memory controller 236 can be tested through selection of different trace run lengths by selector 160 of propagation delay element 168. As with test impedance 166, select signals 34 supplied by CPU 30 control selection of a delay by selector 160 of propagation delay element 168. In an alternative embodiment of the present invention, the installation of DUT 14 at various locations on the DDR memory bus can be simulated by including within connector 22 a series of dummy packaged devices (not illustrated) that can be connected to the DDR memory bus in a selectable order relative to DUT 14. In this manner, testing can simulate the installation of DUT 14 as being on the module closest to DDR memory controller 236, second closest to DDR memory controller 236, etc.

Figure 4:
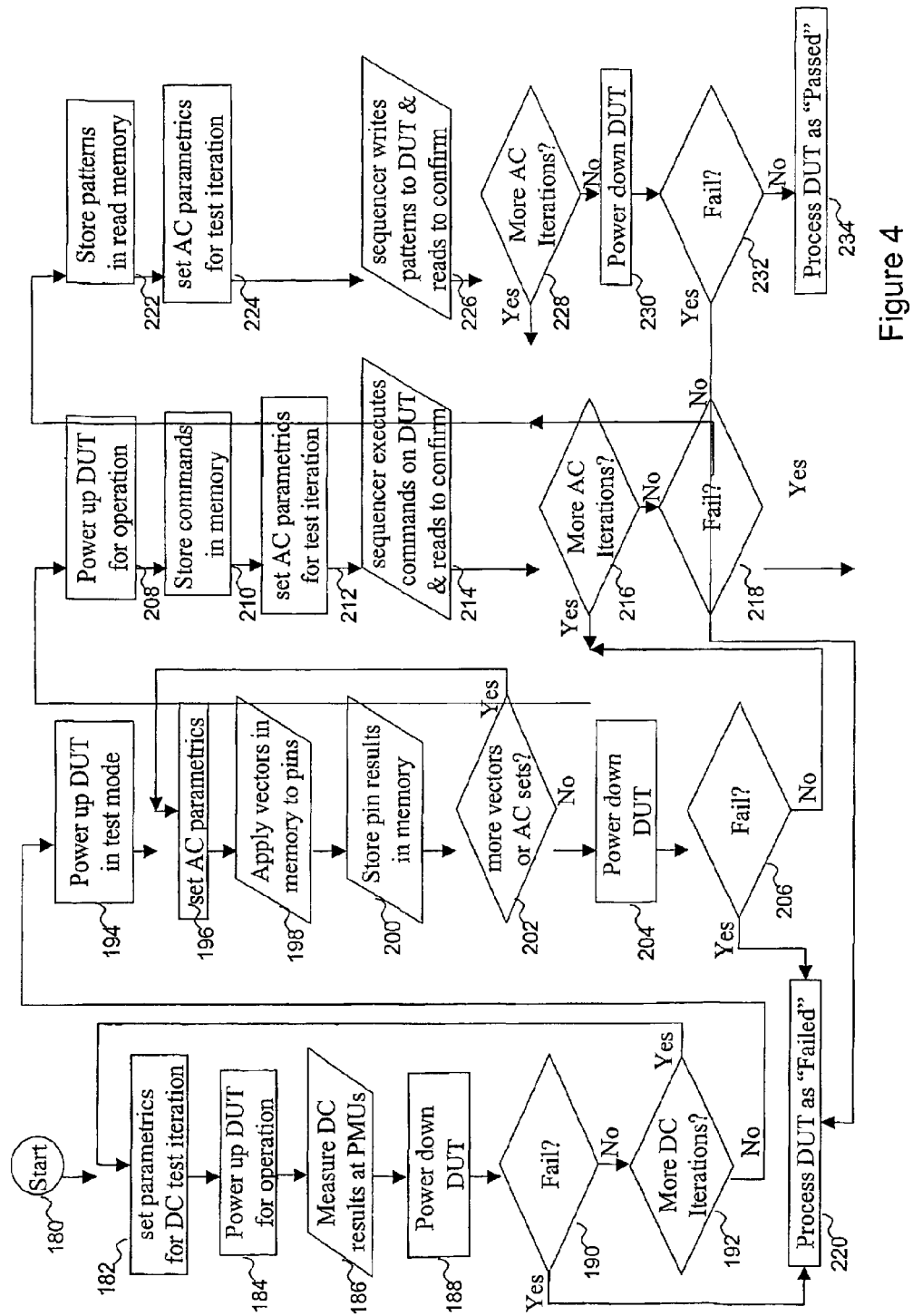
FIG. 4 is a high level flowchart of an exemplary test process for testing DDR memory in accordance with the present invention.

With reference now to FIG. 4, there is illustrated a high-level logical flowchart of an exemplary process for testing DDR memory, either on wafer or in packaged DDR DRAM devices, utilizing tester 10 from FIG. 1. As illustrated, the process begins at block 180 and then proceeds to block 182, which depicts tester 12 setting the parameters for DC parametric tests upon a DUT 14 while DUT 14 is idle. At block 184, CPU 30 powers up DUT 14, and, at block 186, causes tester logic 50 to measure the DC parametric data of DUT 14. To perform the DC parametric tests, CPU 30 uses unillustrated connections to set relays 92 to connect the output pins of DUT 14 to PMUs 80 rather than DDR memory controller 236. PMUs 80 then measure the power dissipation of DUT 14 for one or more sets of $V_{REF}$, $V_{DD}$ and $V_{DDA}$ voltages. In addition, PMUs 80 measure the leakage current of the pins of DUT 14. These power and current measurements are then transferred to sequencer 100 via unillustrated connections for storage in RAM 104 and comparison with acceptable values to obtain a pass/fail determination at block 190 after DUT 14 is powered down at block 188. If DUT 14 fails, the process terminates at block 220, which illustrates that DUT 14 is processed as a failing device. If, however, DUT 14 passes, the process loops back to block 184 until all desired DC test sets are complete, as shown at block 192.

Upon completion of DC testing, the process proceeds from block 192 to block 194, which illustrates CPU 30 powering up DUT 14 in test mode. The process proceeds to block 196, which depicts CPU 30 setting the AC parameters to be utilized during DDR DRAM vector testing. Vector testing is then performed and the results are stored in RAM 104, as shown at blocks 198–200 and as described in detail below. As represented by decision block 202, DDR DRAM die vector testing (and each of the other AC tests) is preferably performed with multiple different sets of AC parameters in order to assess the proper operation of DUT 14 over a wide range of AC parameters. For DUTs 14 that comprise DDR memory, the AC parameters that can be varied include those summarized below in Table I. Other or additional AC parameters can be tested for different DUTs.

TABLE I

| AC parameter | Description |
| --- | --- |
| $T_{CK}$ | Reciprocal of transfer clock frequency |
| $T_{DS}$ | Setup time for DUT (i.e., period defining valid WRITE data) |
| $T_{DH}$ | Hold time for DUT (i.e., period defining valid WRITE data) |
| $T_{DQSQ}$ | Time to valid data output (i.e., period defining valid READ data) |
| $T_{QH}$ | Output hold time from DQS (i.e., period defining valid READ data) |
| $V_{REF}$ | I/O reference voltage that defines midpoint between the logic low input voltage ($V_{IL}$) and logic high input voltage ($V_{IH}$) |
| $V_{DD}$ | System power supply voltage |

Figure 5A:
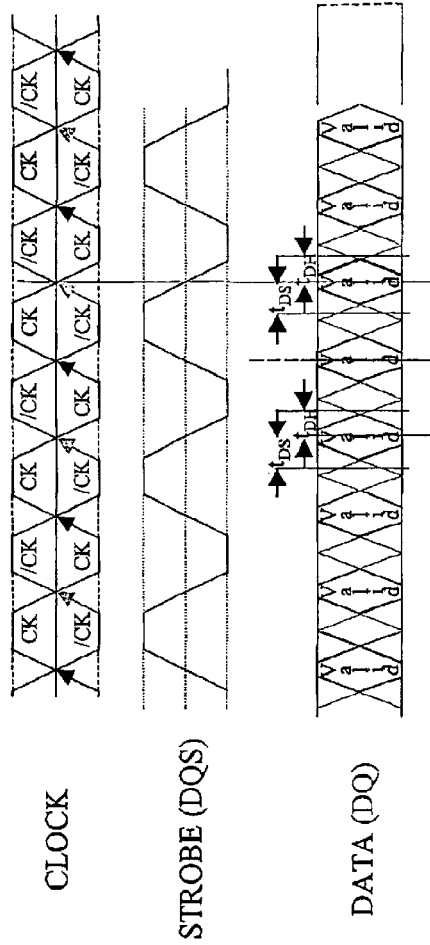
FIG. 5A is a timing diagram illustrating the timing of the data strobe (DQS) signals provided to DDR memory under test in relation to the setup and hold times of WRITE operations to the DDR memory.
Figure 5B:
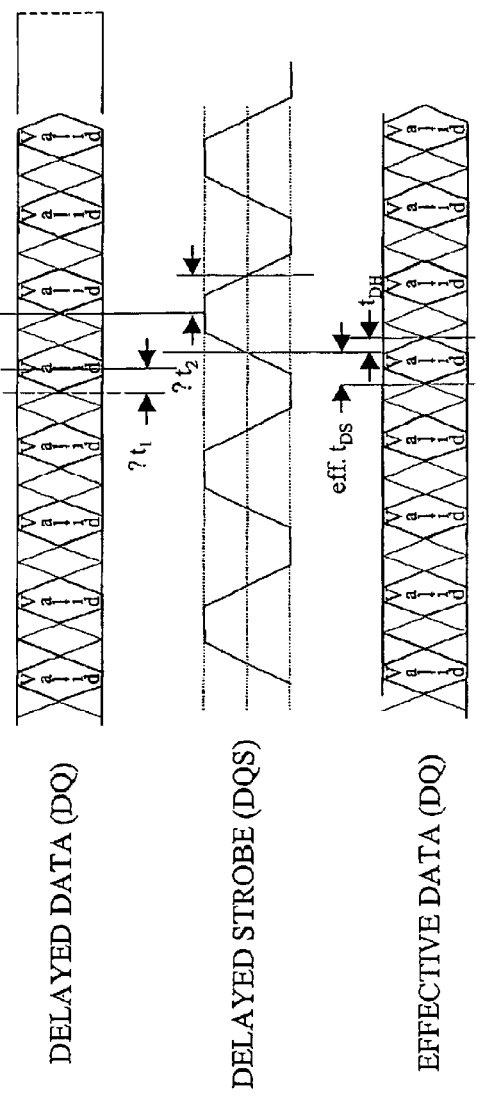
FIG. 5B is a timing diagram depicting the use of a programmable delay in the data strobe (DQS) signals provided to DDR memory under test to test the timing sensitivity of WRITE operations.

CPU 30 sets the $T_{CK}$ parameter by generating appropriate clock selects 38 to select clock sources 122 of desired frequencies to supply controller clocks 120. In a typical testing scenario, it is desirable to select DUT clock frequencies below, at, and above the rated clock frequency of DUT 14. For example, for a DDR DRAM DUT 14 having a rated clock frequency of 333 MHz, it is desirable to performing testing at a number of transfer clock frequencies ranging from approximately 200 MHZ to approximately 366 MHz, which is approximately 333 MHz plus a 10% guard band. In order to test the sensitivity of DUT 14 to the timing of WRITE operations, CPU 30 sets the $T_{DS}$ and $T_{DH}$ parameters by generating DUT delay signals 42 to select the delay applied by delays 240 to data strobe DQS and data DQ within signals 244 output to DUT 14 by DDR memory controller 236. As illustrated in FIG. 5A, which depicts signal timing without any delay, the midpoint crossing of DQS defines the midpoint of a transfer of data and provides timing with which data DQ from DDR memory controller 236 is sampled by DUT 14. The extent of the valid period is equal to the sum of a setup time ($t_{DS}$) prior to the crossing of the midpoint by strobe DQS during which the data must be valid and a hold time ($t_{DH}$) following the crossing of the midpoint by strobe DQS during which the data must be stable. As shown in FIG. 5B, the sensitivity of DUT 14 to variations in WRITE timing can be tested by applying separate delays to data strobe DQS and data DQ while DDR memory controller 236 supplies appropriate row and column signals for the WRITE operation. Delays 240 provide a delay to data DQ of length $\Delta t_1$ and provide a delay to strobe DQS of length $\Delta t_2$. Since $\Delta t_2$ is greater than $\Delta t_1$, strobe DQS is sent to DUT 14 later than data DQ and initiates sampling beyond the midpoint of the data transfer to DUT 14. By doing so, the hold time ($t_{DH}$) is effectively decreased by the difference of $\Delta t_2$ minus $\Delta t_1$, and the timing sensitivity of DUT 14 can be evaluated. As a subset of this means, a delay may be applied to either data strobe DQS or data DQ individually.

Figure 6A:
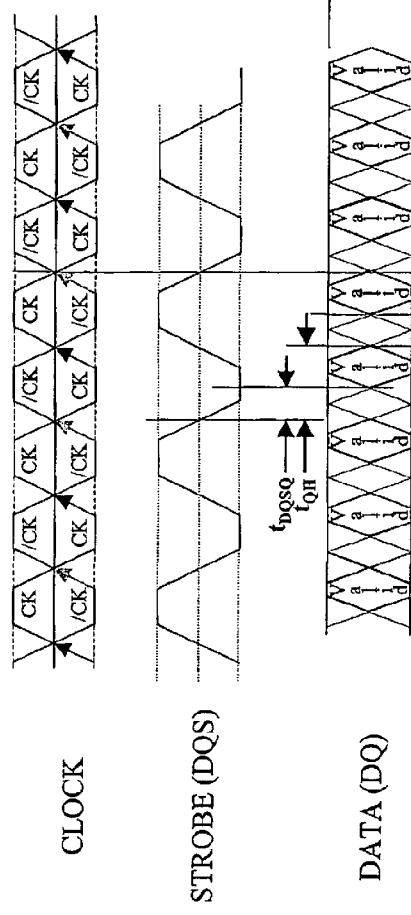
FIG. 6A is a timing diagram illustrating the timing of data strobe (DQS) signals provided from DDR memory under test in relation to the valid times for sampling DDR memory output pins during READ operations.
Figure 6B:
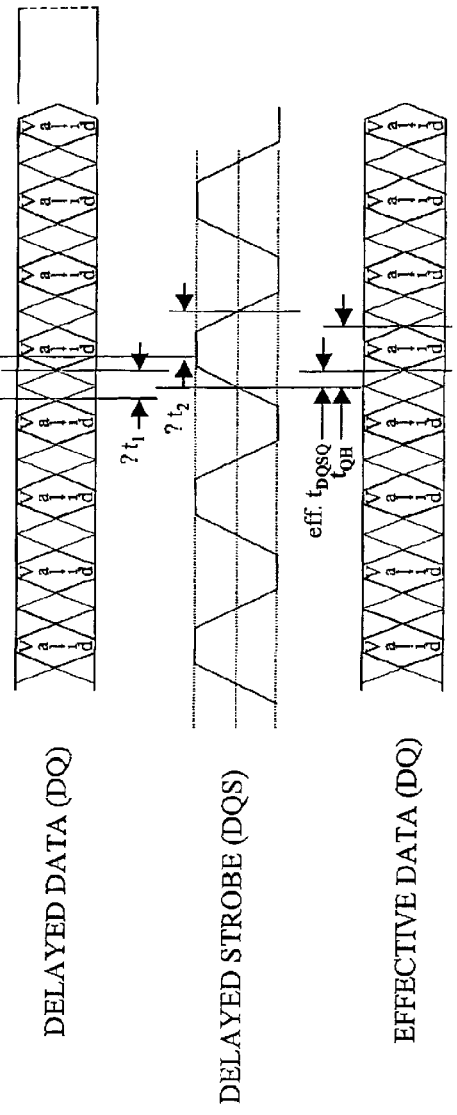
FIG. 6B is a timing diagram depicting the use of a programmable delay in the data strobe (DQS) signals provided from DDR memory under test to test the timing sensitivity of READ operations.

CPU 30 similarly tests the timing sensitivity of DUT 14 during READ operations by setting the $T_{QH}$ and $T_{DQSQ}$ parameters through generation of TL delay signals 40 that select delays applied by delays 238 to the data strobe DQS and data DQ signals in signals 242. As illustrated in FIG. 6A, which depicts signal timing without any applied delay, the midpoint crossing of DQS defines the start of the period during which data DQ read out of DUT 14 are valid for sampling by DDR memory controller 236. The extent of the valid period of the READ transfer is equal to the difference of $T_{QH}$ minus $T_{DQSQ}$. As shown in FIG. 6B, the sensitivity of DUT 14 to variations in READ timing can be tested by applying delays $\Delta t_1$ and $\Delta t_2$ to data DQ and data strobe DQS, respectively and the timing sensitivity of DUT 14 can be evaluated. Since $\Delta t_2$ is greater than $\Delta t_1$, the strobe DQS is sent to DUT 14 later than data DQ and initiates sampling by DDR memory controller 236 after the start of the data transfer by DUT 14. As a result, the time for DQS-to-DQ skew ($t_{DQSQH}$) is effectively decreased by the difference of $\Delta t_2$ minus $\Delta t_1$, and the timing sensitivity of DUT 14 can be evaluated. As a subset of this means, delays may be limited to either data strobe DQS or data DQ individually.

Figure 8:
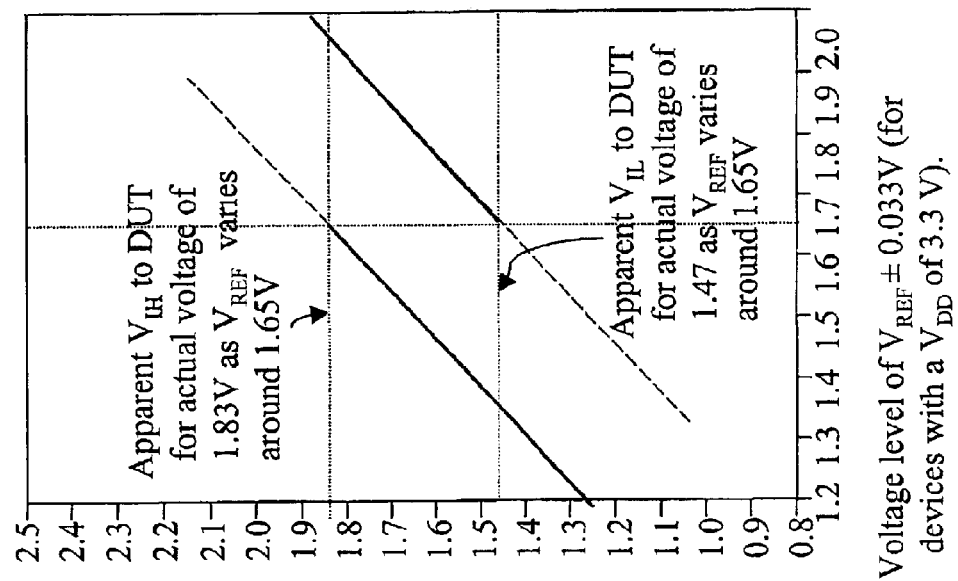
FIG. 8 depicts how variation in the $V_{REF}$ parameter can simulate variation in the voltage levels of inputs from the tester logic, both high ($V_{IH}$) and low ($V_{IL}$)

$V_{DD}$ and $V_{REF}$ are set by CPU 30 utilizing voltage select signals 44 in order to test DUT 14 for supply voltage margin and reference voltage sensitivity, respectively. Because DUT 14 calibrates $V_{IL}$ and $V_{IH}$ to $V_{REF}$, varying $V_{REF}$ also tests the sensitivity of DUT 14 to various input voltage levels without the need to actually vary the voltage levels of the data inputs provided to DUT 14. The relationship between $V_{REF}$ and apparent $V_{IL}$ and $V_{IH}$ is depicted in FIG. 8.

Referring again to FIG. 4, after the AC parameters are set at block 196, CPU 30 downloads vector data and correct test results to sequencer 100, which stores them in RAM 104. Sequencer 100 utilizes the vector data to stimulate appropriate input pins of DUT 14 to exercise the built-in self-test (BIST) capabilities of DUT 14. In addition, sequencer 100 tests the sensitivity of DUT 14 to the timing of READ and WRITE operations in combination with variable reference voltage $V_{REF}$. Failures caused by combinations of timing parameter changes in combination with sensitivity to input voltage levels induced by $V_{REF}$ variation are discovered by performing successive tests of DUT 14 with different parametric combinations. The probability of failure during testing can be increased or decreased by:

(1) varying test impedance 166 from the characteristic impedance of the end-use environment in order to affect the amplitude of the DDR memory bus reflections; and/or (2) varying the delay applied by delay element 168 to simulate different locations of DUT 14 on the DDR channel, which affects the timing of reflections on the DDR memory bus relative to the output of DUT 14; and/or (3) varying $V_{REF}$ either above or below the standard value (e.g., 1.65±0.033V for devices with a nominal $V_{DD}$ of 3.3 V); and/or (4) varying delays of one or both of data strobe DQS and data DQ.

If failure due to combined conditions of impedance, propagation delays, voltage, and/or timing signal and data delays is observed, CPU 30 preferably determines if the failing DUT 14 can pass the test under simulated work-around conditions. The work-around conditions can be simulated, for example, by applying only certain signal propagation to simulate restricting the installation locations for DUT 14 along the DDR memory bus, by varying $V_{REF}$ outside the nominal specified range to simulate input voltage levels, and by changing the characteristic impedance to a value outside of the specified ranges for end use system environments. If DUT 14 passes the tests under limited operating conditions, the failing DUT 14 can be reclassified as passing subject to the work-around conditions.

As depicted at block 200, sequencer 100 logs the results of the vector test for subsequent comparison of the test results with the correct results to produce a pass/fail determination. As illustrated at block 202, CPU 30 may then alter the AC parameters and repeat the vector test utilizing the new AC parameters. If vector testing has been performed utilizing each desired set of AC parameters DUT 14 is powered down, as shown at block 204. If sequencer 100 determines that DUT 14 passes the Vector tests, the process proceeds to block 208, which is described below. However, if DUT 14 fails Vector testing and a work-around is not implemented, the process terminates at block 220, where DUT 14 is classified as a failing device.

Turning now to blocks 208–220, CPU 30 performs DDR memory bus command testing. As illustrated at block 208, CPU 30 powers up DUT 14. In addition, as depicted at blocks 210–212, CPU 30 downloads a DDR memory bus command set and correct results to sequencer 100, which stores them in RAM 104 and then sets initial AC parameters for the test iteration. As shown at block 214, sequencer 100 transfers the DDR memory bus commands to DUT 14, logs responses of DUT 14 to the bus commands in a test log in RAM 104, and compares the responses with the correct results to make a pass/fail determination. Following block 214, the process proceeds to block 216, which represents CPU 30 causing sequencer 100 to repeat the DDR memory bus command test for each set of AC parameters.

As shown at block 218, if DUT 14 fails DDR memory bus command testing, the process terminates at block 220 with DUT 14 identified as failing. However, if DUT 14 passes DDR memory bus command testing, the process illustrated in FIG. 4 next proceeds to blocks 222–234, which depict data pattern testing. Block 222 shows CPU 30 downloading to sequencer 100 a set of data patterns to be written into and read from the memory arrays of DUT 14. Sequencer 100 stores the data patterns in RAM 104. CPU 30 also establishes initial AC parameters for DDR core testing at block 224.

As depicted at block 226, sequencer 100 then issues WRITE and READ operations to DUT 14 to verify operation of the memory arrays of DUT 14 utilizing the data patterns stored in RAM 104. A typical core test suite for DUT 14 includes the individual tests summarized below in Table II.

TABLE II

| DDR core test suite tests | Description |
| --- | --- |
| Address | ensures that all memory array locations can be accessed |
| Data | verifies that each memory bit operates as both a 1 and a 0 |
| Refresh | memory array properly retains data |
| March algorithms | data patterns read out of memory array match those written into memory array |
| Disturb Neighborhood Sensitivity Test (DNST) | modifying contents of a memory cell in the memory array does not modify data stored in neighboring memory cells |

Data received from DUT 14 in response to READ accesses are compared with the expected data pattern by sequencer 100 to make a pass/fail determination for DUT 14. As illustrated at block 228, CPU 30 may instruct sequencer 100 to perform tests in the DDR core test suite utilizing a number of additional AC parameter sets.

After powering down DUT 14 at block 230, sequencer 100 determines whether DUT 14 passed or failed data pattern testing. Thus, at the termination of testing, sequencer 100 classifies DUT 14 as passing (as shown at block 234) or failing (as depicted at block 220). Sequencer 100 relays the pass/fail determinations to CPU 30, which reports the pass/fail determination for this DUT 14 to host 16.

Figure 7:
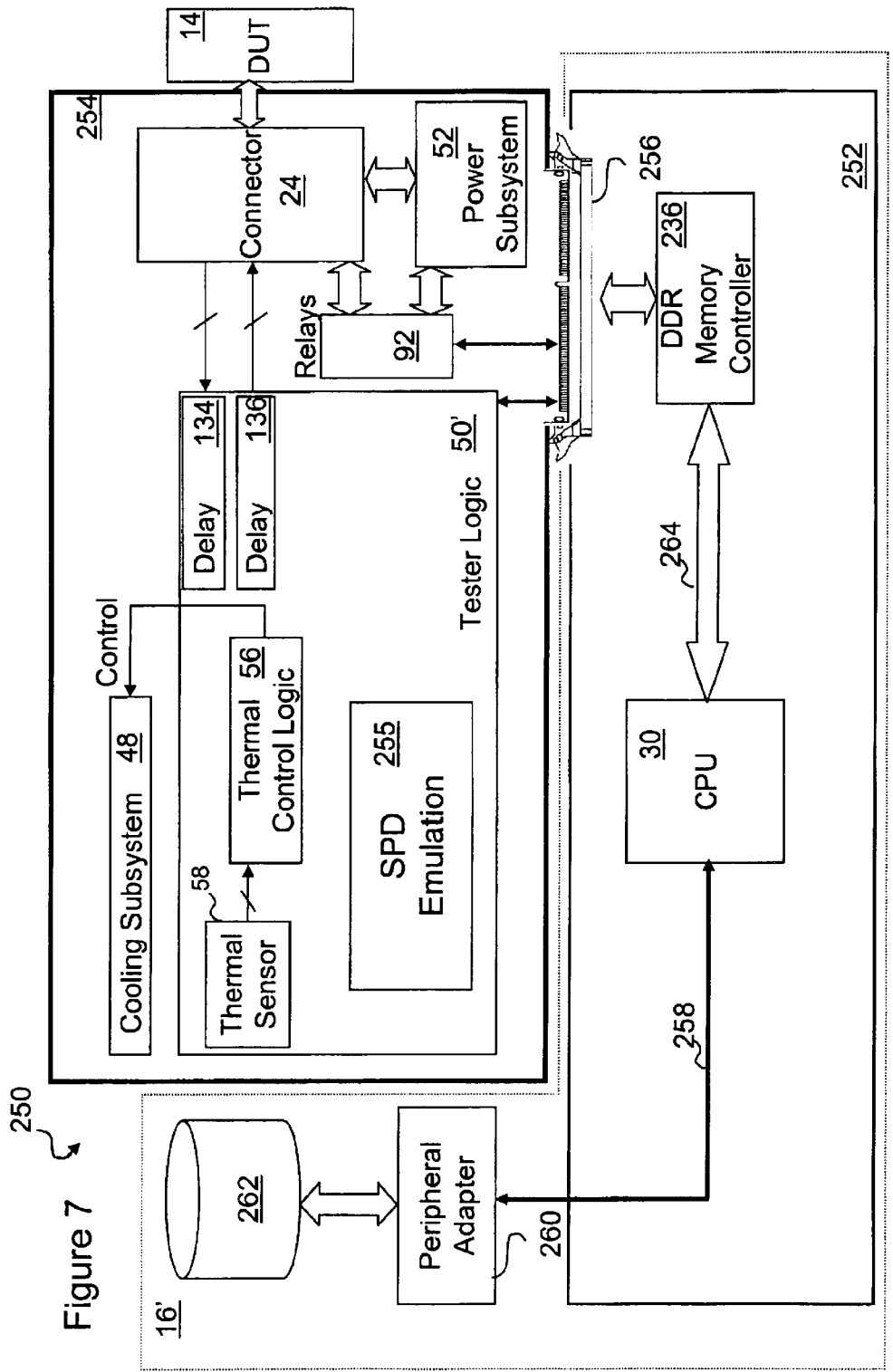
FIG. 7 illustrates an alternative embodiment of a memory tester in accordance with the present invention.

Referring now to FIG. 7, there is depicted a high-level block diagram of a host-based memory tester 250 in accordance with an alternative embodiment of the present invention. In FIG. 7, like reference numerals are utilized to identify elements similar to or the same as those of the memory tester embodiment illustrated in FIGS. 1–3.

As shown, memory tester 250 comprises a host 16' and a tester logic board 254. Host 16', which may comprise, for example, a conventional personal computer system or other data processing system, includes a system board 252 having a peripheral interconnect 258 to which CPU 30 and peripheral adapter 260 are coupled for communication. DDR memory bus 264 couples CPU 30 for communication with DDR memory controller 236, which is connected to one or more DDR memory module sockets 256 mounted on system board 252. Peripheral adapter 260 is coupled to a storage device 262 that provides non-volatile storage for test procedures, test parameters, and test data.

Memory tester 250 employs a host-based tester architecture that permits CPU 30 of host 16' to test a DDR DUT 14 as if DUT 14 were mounted on a standard DDR memory module through the installation, in socket 256, of a tester logic board 254 having an impedance-controlled connector 22 for DUT 14. Like tester logic board 12 of FIG. 2, tester logic board 254 includes a cooling subsystem 48 and a power subsystem 52, as well as tester logic 50'. In the alternative embodiment shown in FIG. 7, tester logic 50' is greatly simplified as compared to tester logic 50 of FIG. 2 in that no sequencer 100 is required and the DDR memory controller 236 utilized for testing is mounted on system board 252. The one major addition to tester logic 50' is a serial presence detect (SPD) emulation circuit 255 that identifies tester logic board 254 to host 16' as a DDR memory module upon system reset. Information regarding the operation of SPD emulation circuit 255 may be found, for example, in *JEDEC Standard* 21-C *SPD Specification,* June 2000, which is incorporated herein by reference.

In operation, memory tester 250 utilizes the test information stored by storage device 262 (or remotely stored test information communicated via a communication connection) to test DUT 14 according to the test process depicted in FIG. 4 and described above. The major difference in the manner in which testing is performed by the embodiment of FIG. 7 is that CPU 30 directly accesses DUT 14 as if DUT 14 were mounted on a DDR memory module installed in socket 256. Thus, for example, to write to or read from DUT 14, CPU 30 issues an appropriate request on DDR memory bus 264, which DDR memory controller 236 passes utilizing CMOS signaling. In response to the request, DDR memory controller 236 issues a command to DUT 14 via socket 256 and connector 22. Responses by DUT 14 to access commands are returned via the same path. CPU 30 can then compare the responses provided by DUT 14 with expected results to male pass/fail determinations for various tests.

Referring now to FIG. 9A, there is depicted a host system 300 that employs an advanced packet protocol memory architecture in lieu of a conventional master/slave memory interface. In particular, host 300 includes a CPU 302 coupled to a packet protocol controller 304. Packet protocol controller 304, which includes an SDRAM controller 306 and a packet protocol interface 308, communicates 64-bit data packets with packet protocol system memory 310 via packet protocol bus 305 in response to READ and WRITE accesses by CPU 302. As shown, packet protocol system memory 310 includes conventional DRAM cells, such as SDRAM core 314, as well as a packet protocol interface 312 to support communication over packet protocol bus 305. Utilizing conventional memory testing methodologies, a packet protocol system memory device under test would require extremely complex test equipment.

However, the present invention can greatly simplify testing of unconventional memory architectures such as that depicted in FIG. 9A. For example, FIG. 9B illustrates an exemplary tester 320 for testing a packet protocol system memory DUT that employs a similar tester architecture to the testers illustrated in FIGS. 1, 2 and 7. In particular, as indicated by like reference numerals identifying like or corresponding elements, tester 320 adopts an architecture similar to the host 300 that represents an end-use environment of packet protocol system memory DUT 310'. As shown, tester 320 may utilize a sequencer 322 in place of the more complex (and expensive) CPU 302. However, the principal differences between host 300 and tester 320 are that tester 320 permits the connection of packet protocol system memory DUTs 310' in the form of wafer die and packaged devices rather than only modules and the control of parameters affecting memory access, including voltage, timing delays, bus characteristic impedance, and propagation delays, as described above with respect to FIGS. 1, 2, and 7.

FIG. 9C illustrates an alternative embodiment of a tester 330 for testing a packet protocol system memory DUT in accordance with the present invention. As is apparent by comparison of FIGS. 9C and 9B, tester 330 has much the same construction as tester 320 of FIG. 9B, except for the use of a packet protocol interface 308' external to SDRAM controller 306'. Use of an external packet protocol interface 308' permits extension of the testers shown in FIGS. 1, 2 and 7, which may incorporate tester logic designed for other memory types, such as DDR, for testing memory devices via a packet protocol bus.

With reference now to FIGS. 10A and 10B, there are illustrated two high level views of a high level memory tester architecture for testing a memory DUT that supports a transfer frequency greater than twice the memory clock frequency. For example, in the depicted embodiments, testers 340 and 350, which each include a 64-bit sequencer 322, test a 32-bit quad data rate (QDR) SDRAM DUT 346 that supports data transfers at four times the frequency of memory clock 348. This is achieved by coupling a shift register 344, 344' between a DDR memory controller 342, 342' and DUT 346 to increase the frequency of data transfers to and from DUT 346. As shown, shift register 344 can either be external to SDRAM controller 342 as shown in FIG. 10A or integrated with SDRAM controller 342 to form a QDR SDRAM controller 352 as shown in FIG. 10B. The use of a shift register 344 with a tester as shown in FIGS. 10A and 10B permits extension of the testers shown in FIGS. 1, 2 and 7, which may incorporate tester logic designed for other memory types such as DDR, for testing memory devices having a data transfer frequency greater than twice the memory clock frequency.

Figure 11:
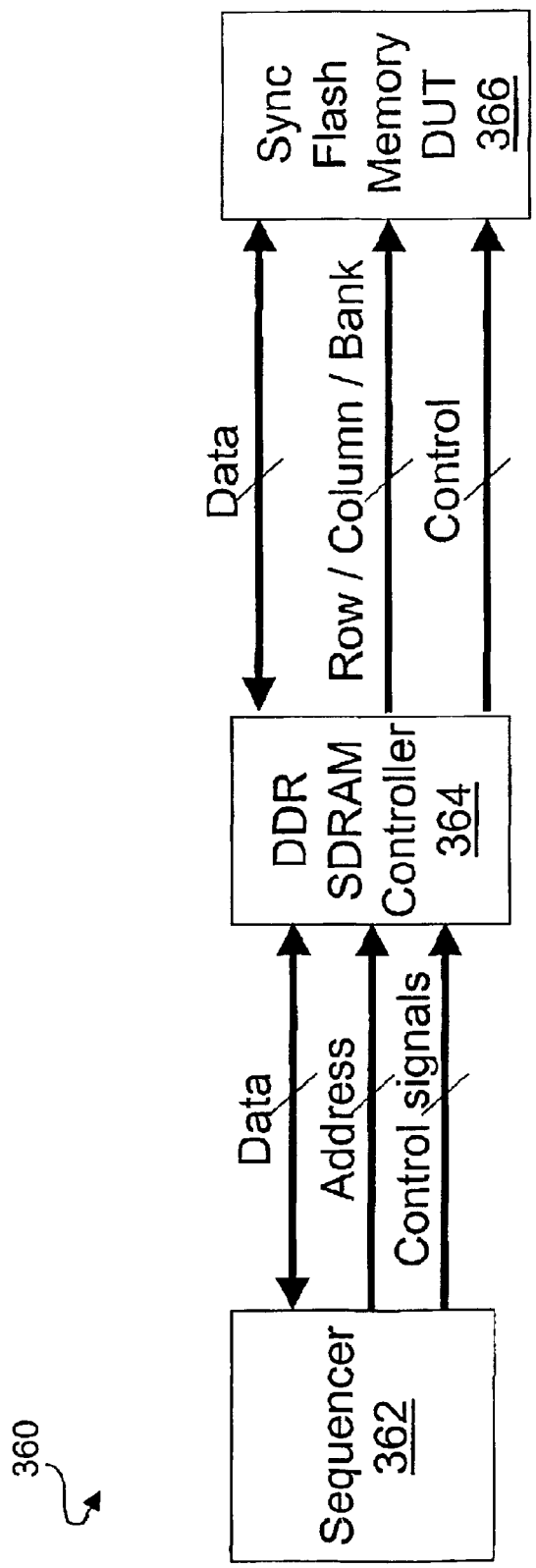
FIG. 11 depicts a memory tester that utilizes a DDR memory controller to test a flash memory DUT having a synchronous memory interface.

Referring now to FIG. 11, there is depicted a high level block diagram of an exemplary architecture of a memory tester 360 for testing a flash memory DUT 366 having a synchronous DRAM interface. As depicted, memory tester 360 includes a sequencer 362 coupled to a DDR SDRAM controller 364, which is in turn coupled to flash memory DUT 366. By employing a memory controller having a programmable transfer rate, the memory testers shown in FIGS. 2 and 7 can be adapted to support testing of memory devices (including flash memory) at any multiple of the memory clock frequency.

Figure 12:
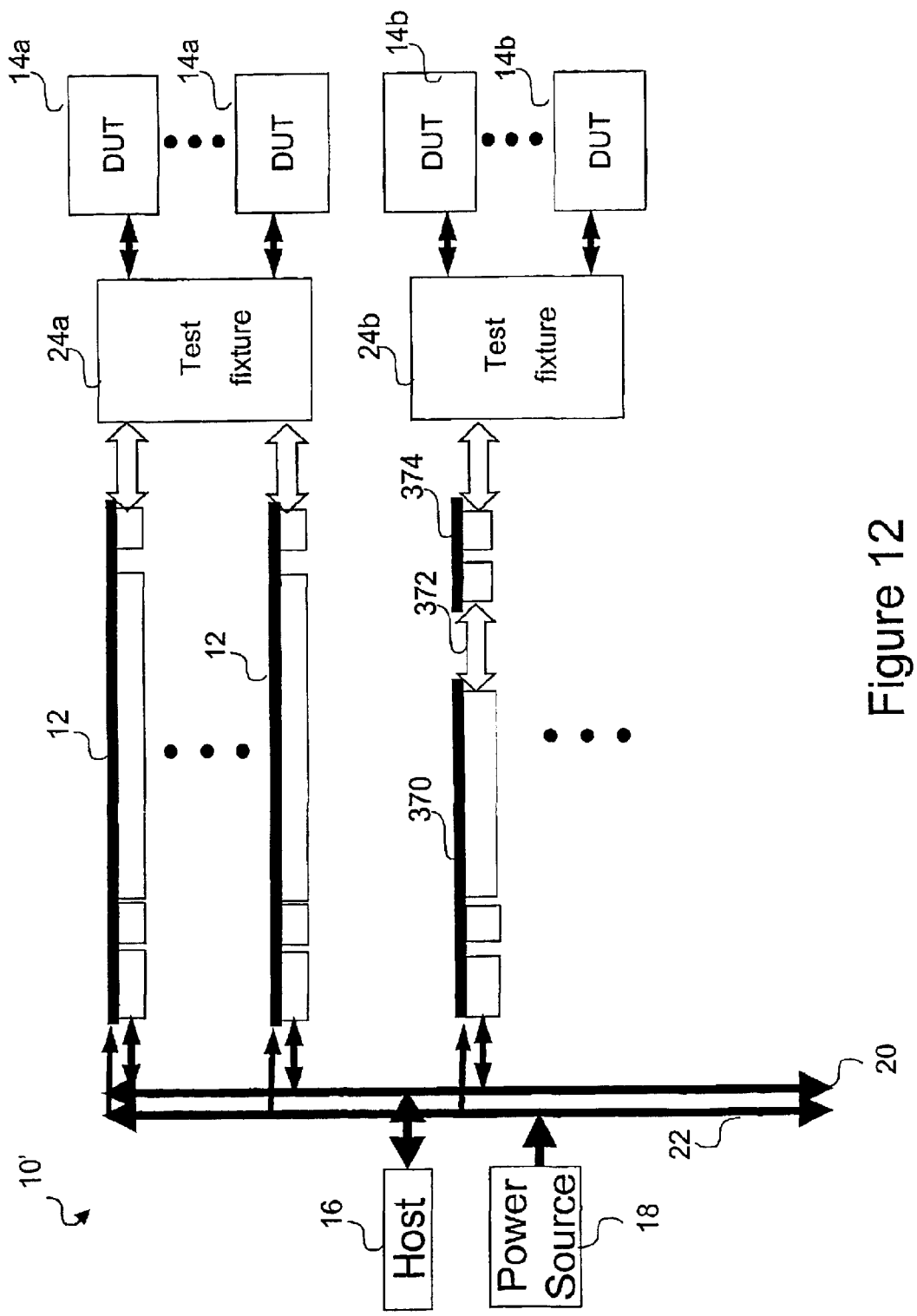
FIG. 12 illustrates a tester architecture having a universal tester logic board and removable DUT control modules to allow testing of multiple types of memory DUTs utilizing a single tester logic board.

With reference now to FIG. 12, there is illustrated an alternative embodiment of a tester 10' for a testing a plurality of diverse DUTs. As above, like and corresponding reference numbers are utilized within FIG. 12 to identify features corresponding to those within tester 10 illustrated in FIG. 1.

In addition to tester logic boards 12 described in detail above, tester 10' may have installed therein one or more universal test logic boards 370 containing tester logic that is generic to all memory DUTs. Each universal test logic board 370 is coupled via a standardized connector 372 to a DUT-specific tester module 374 containing a memory controller, delay circuits, and address hashing hardware specific to one of a plurality of types of memory DUTs. Tester module 374 is in turn coupled to a DUT 14b via a DUT-specific test fixture 24b that provides connections appropriate to the type and process stage (i.e., wafer, packaged device, or module) of DUT 14b. Because tester 10' can be rapidly configured for testing any of a plurality of diverse memory DUTs simply by installing the appropriate tester module(s) 374, testing that formerly required a separate tester for each type of memory device (e.g., DDR, SDRAM, SRAM, Flash and Rambus) can now be performed utilizing a single tester 10' in accordance with the present invention.

While the invention has been particularly shown and described with reference to a preferred embodiment, it will be understood by those skilled in the art that various changes in form and detail may be made therein without departing from the spirit and scope of the invention. For example, although aspects of the present invention have been described with respect to a tester system executing software that directs the functions of the present invention, it should be understood that the present invention may alternatively be implemented as a program product for use with a data processing system. Programs defining the functions of the present invention can be delivered to a data processing system via a variety of signal-bearing media, which include, without limitation, non-rewritable storage media (e.g., CD-ROM), rewritable storage media (e.g., a floppy diskette or hard disk drive), and communication media, such as digital and analog networks. It should be understood, therefore, that such signal-bearing media, when carrying or encoding computer readable instructions that direct the functions of the present invention, represent alternative embodiments of the present invention.

What is claimed is:

1. A tester for testing memory dice on a wafer, said tester comprising:
    a wafer probe card having connections for at least one device under test that comprises a double data rate (DDR) memory die on a wafer, wherein the connections of the wafer probe card present an impedance selected to emulate a characteristic impedance of an end-use environment for a packaged device containing the memory die; and
    tester logic, coupled to the wafer probe card, that communicates test data with the device under test via the wafer probe card.

2. The tester of claim 1, wherein the end-use environment is one of the set of a DDR memory bus and a DDR memory module, and wherein the characteristic impedance is approximately 60 ohms.

3. The tester of claim 1, wherein the connections comprise microsprings.

4. The tester of claim 1, said wafer probe card including a variable impedance network having a dynamically alterable impedance selected by the tester logic.

5. The tester of claim 1, wherein said wafer probe card includes at least one dummy packaged device to simulate operating characteristics of the end-use environment.

6. The tester of claim 1, wherein the at least one device under test includes memory cells, and wherein the tester logic includes means for communicating voltage signals to the at least one device under test to alter which of the memory cells are active for operations to specific address locations.

7. The tester of claim 1, wherein the tester logic includes a DDR memory controller that interfaces with the wafer probe card.

8. The tester of claim 1, wherein the tester logic further comprises:
    a clock generator that generates at least one clock signal received by the tester logic and at least one timing signal that coordinates data transfer between the tester logic and the at least one device under test; and
    one or more delay elements that selectively alter the relative phases of the at least one clock signal and the at least one timing signal to test timing sensitivity of the at least one device under test.

9. The tester of claim 8, wherein during a WRITE operation, the one or more delay elements delay the at least one timing signal received by the at least one device under test relative to write data.

10. The tester of claim 9, wherein the at least one timing signal received by the at least one device under test during the WRITE operation comprises a data strobe (DQS) signal.

11. The tester of claim 10, wherein the tester logic outputs to the device under test data signals and row and column signals while the one or more delay elements delay the data strobe (DQS) signal to the device under test to test sensitivity of the device under test to input hold and input setup timing parameters.

12. The tester of claim 8, wherein during a READ operation the one or more delay elements delay the at least one timing signal to the tester logic relative to read data received from the device under test.

13. The tester of claim 12, wherein the at least one timing signal received by the tester logic comprises a data strobe (DQS) signal.

14. The tester of claim 8, wherein the one or more delay elements shift phases of both data signals and the at least one timing signal in small increments.

15. The tester of claim 14, wherein:
said tester further comprises a power subsystem including a variable reference voltage supply and variable supply voltage supply coupled to said wafer probe card to supply a reference voltage and a supply voltage to said at least one device under test through said connections; and
said tester logic comprises means for testing sensitivity of the device under test to timing and voltage combinations by setting the one or more delay elements to delay data strobe and data signals while setting outside of its normal operating voltage range at least one of the set of the reference voltage and supply voltages.

16. The tester of claim 15, wherein:
the wafer probe card comprises at least one variable impedance; and
the tester logic comprises means for varying the variable impedance to test sensitivity of said at least one device under test while testing with multiple combinations of timing signal and data delays and reference and supply voltages.

17. The tester of claim 8, wherein:
said tester further comprises a power subsystem including a variable reference voltage supply coupled to said wafer probe card to supply a reference voltage to said at least one device under test through said connections; and
the tester logic comprises means for varying the reference voltage to simulate variation of input voltage levels to test sensitivity of said at least one device under test to input voltage variations.

18. The tester of claim 1, wherein the tester logic further comprises:
a clock generator that generates at least one clock signal received by the tester logic and at least one timing signal that coordinates data transfer between the tester logic and the at least one device under test; and
one or more delay elements that selectively alter the phase of data signals communicated between the at least one device under test and the tester logic to test timing sensitivity of the at least one device under test.

19. The tester of claim 18, wherein the at least one timing signal is received by the at least one device under test from the tester logic and comprises a data strobe signal; and
said tester logic includes one or more delay elements that during a WRITE operation selectively delay data signals received by the at least one device under test from the tester logic to test timing sensitivity of the at least one device under test for input hold and input setup timing parameters.

20. The tester of claim 18, wherein the at least one timing signal is received by the tester logic from the at least one die and comprises a data strobe signal; and
said tester logic includes one or more delay elements that during a READ operation selectively delay data signals received by the tester logic from the at least one device under test to test timing sensitivity of the at least one device under test.

21. A tester for packaged integrated circuit memory devices, said tester comprising:
a test fixture having connections for at least one device under test that comprises a packaged integrated circuit double data rate (DDR) memory device, wherein the connections of the test fixture present an impedance selected to emulate a characteristic impedance of an end-use environment for the at least one device under test; and
tester logic, coupled to the test fixture, that communicates test data with the packaged memory device via the test fixture.

22. The tester of claim 21, wherein the end-use environment is a DDR memory module and the characteristic impedance is approximately 60 ohms.

23. The tester of claim 21, wherein the connections comprise microsprings.

24. The tester of claim 21, said test fixture including a variable impedance network having a dynamically alterable impedance selected by the tester logic.

25. The tester of claim 21, wherein said test fixture includes at least one dummy packaged integrated circuit device to simulate operating characteristics of the end-use environment.

26. The tester of claim 21, wherein the tester logic includes a DDR memory controller that interfaces with the test fixture.

27. The tester of claim 21, wherein the tester logic further comprises:
a clock generator that generates at least one clock signal received by the tester logic and at least one timing signal that coordinates data transfer between the tester logic and the at least one device under test; and
one or more delay elements that selectively alter the relative phases of the at least one clock signal and the at least one timing signal to test timing sensitivity of the at least one device under test.

28. The tester of claim 28, wherein during a WRITE operation, the one or more delay elements delay the at least one timing signal received by the at least one device under test relative to write data.

29. The tester of claim 28, wherein the at least one timing signal received by the at least one device under test during the WRITE operation comprises a data strobe (DQS) signal.

30. The tester of claim 29, wherein the tester logic outputs to the device under test data signals and row and column signals while the one or more delay elements delay the data strobe (DQS) signal to the device under test to test sensitivity of the device under test to input hold and input setup timing parameters.

31. The tester of claim 28, wherein during a READ operation the one or more delay elements delay the at least one timing signal to the tester logic relative to read data received from the device under test.

32. The tester of claim 31, wherein the at least one timing signal received by the tester logic comprises a data strobe (DQS) signal.

33. The tester of claim 27, wherein the one or more delay elements shift phases of both data signals and the at least one timing signal in small increments.

34. The tester of claim 33, wherein:
said tester further comprises a power subsystem a variable reference voltage supply and variable supply voltage supply coupled to said test fixture to supply a reference voltage and a supply voltage to said at least one device under test through said connections; and
said tester logic comprises means for testing sensitivity of the device under test to timing and voltage combinations by setting the one or more delay elements to delay data strobe and data signals while setting outside of its normal operating voltage range at least one of the reference voltage and supply voltages.

35. The tester of claim 34, wherein:
the test fixture comprises at least one variable impedance; and
the tester logic comprises means for varying the variable impedance to test sensitivity of said at least one device under test while testing with multiple combinations of timing signal and data delays and reference and supply voltages.

36. The tester of claim 27, wherein:
said tester further comprises a power subsystem including a variable reference voltage supply coupled to said test fixture to supply a reference voltage to said at least one device under test through said connections; and
the tester logic comprises means for varying the reference voltage to simulate variation of input voltage levels to test sensitivity of said at least one device under test to input voltage variations.

37. The tester of claim 21, wherein the tester logic further comprises:
a clock generator that generates at least one clock signal received by the tester logic and at least one timing signal that coordinates data transfer between the tester logic and the at least one device under test; and
one or more delay elements that selectively alter the phase of data signals communicated between the at least one device under test and the tester logic to test timing sensitivity of the at least one device under test.

38. The tester of claim 37, wherein the at least one timing signal is received by the at least one device under test from the tester logic and comprises a data strobe signal; and
said tester logic includes one or more delay elements that during a WRITE operation selectively delay data signals received by the at least one device under test from the tester logic to test timing sensitivity of the at least one device under test for input hold and input setup timing parameters.

39. The tester of claim 37, wherein the at least one timing signal is received by the tester logic from the at least one die and comprises a data strobe signal; and
said tester logic includes one or more delay elements that during a READ operation selectively delay data signals received by the tester logic from the at least one device under test to test timing sensitivity of the at least one device under test.

40. A tester for memory modules, said tester comprising:
a test fixture having connections for at least one device under test that comprises a double data rate (DDR) memory module, wherein the connections of the test fixture present an impedance selected to emulate a characteristic impedance of an end-use environment for the memory module; and
tester logic, coupled to the test fixture, that communicates test data with the at least one device under test via the test fixture.

41. The tester of claim 40, wherein the end-use environment is a host system that employs at least one DDR memory module and the characteristic impedance is approximately 60 ohms.

42. The tester of claim 40, wherein the connections comprise microsprings.

43. The tester of claim 40, said test fixture including a variable impedance network having a dynamically alterable impedance selected by the tester logic.

44. The tester of claim 40, wherein the tester logic includes a DDR memory controller that interfaces with the test fixture.

45. The tester of claim 40, wherein the tester logic further comprises:
a clock generator that generates at least one clock signal received by the tester logic and at least one timing signal that coordinates data transfer between the tester logic and the at least one device under test; and
one or more delay elements that selectively alter the relative phases of the at least one clock signal and the at least one timing signal to test timing sensitivity of the at least one device under test.

46. The tester of claim 45, wherein during a WRITE operation, the one or more delay elements delay the at least one timing signal received by the at least one device under test relative to write data.

47. The tester of claim 46, wherein the at least one timing signal received by the at least one device under test during the WRITE operation comprises a data strobe (DQS) signal.

48. The tester of claim 47, wherein the tester logic outputs to the device under test data signals and row and column signals while the one or more delay elements delay the data strobe (DQS) signal to the device under test to test sensitivity of the device under test to input hold and input setup timing parameters.

49. The tester of claim 45, wherein during a READ operation the one or more delay elements delay the at least one timing signal to the tester logic relative to read data received from the device under test.

50. The tester of claim 49, wherein the at least one timing signal received by the tester logic comprises a data strobe (DQS) signal.

51. The tester of claim 45, wherein the one or more delay elements shift phases of both data signals and the at least one timing signal in small increments.

52. The tester of claim 51, wherein:
said tester further comprises a power subsystem including a variable reference voltage supply and variable supply voltage supply coupled to said test fixture to supply a reference voltage and a supply voltage to said at least one device under test through said connections; and
said tester logic comprises means for testing sensitivity of the device under test to timing and voltage combinations by setting the one or more delay elements to delay data strobe and data signals while setting outside of its normal operating voltage range at least one of the reference voltage and supply voltages.

53. The tester of claim 52, wherein:
the test fixture comprises at least one variable impedance; and
the tester logic comprises means for varying the variable impedance to test sensitivity of said at least one device under test while testing with multiple combinations of timing signal and data delays and reference and supply voltages.

54. The tester of claim 40, wherein the tester logic further comprises:

a clock generator that generates at least one clock signal received by the tester logic and at least one timing signal that coordinates data transfer between the tester logic and the at least one device under test; and one or more delay elements that selectively alter the phase of data signals communicated between the at least one device under test and the tester logic to test timing sensitivity of the at least one device under test.

55. The tester of claim 54, wherein the at least one timing signal is received by the at least one device under test from the tester logic and comprises a data strobe signal; and said tester logic includes one or more delay elements that during a WRITE operation selectively delay data signals received by the at least one device under test from the tester logic to test timing sensitivity of the at least one device under test for input hold and input setup timing parameters.

56. The tester of claim 54, wherein the at least one timing signal is received by the tester logic from the at least one die and comprises a data strobe signal; and said tester logic includes one or more delay elements that during a READ operation selectively delay data signals received by the tester logic from the at least one device under test to test timing sensitivity of the at least one device under test.

57. A memory tester, comprising:

a connector having connections for a double data rate (DDR) memory device under test that is one of the set of a memory die on a wafer, a packaged integrated circuit memory device and a memory module, wherein the connections of the connector present an impedance selected to emulate a characteristic impedance of an end-use environment for the device under test; and tester logic, coupled to the connector, that communicates test data with the device under test.

58. The memory tester of claim 57, wherein the end-use environment is one of a DDR memory bus and a DDR memory module, and said characteristic impedance is approximately 60 ohms.

59. A method of testing an integrated circuit device, said method comprising:

connecting to connections of a connector a memory device under test that is one of a double data rate (DDR) packaged integrated circuit memory device, a DDR memory die on a wafer, and a memory module, wherein the connections present an impedance selected to emulate a characteristic impedance of an end-use environment for the device under test; and coupling test logic to the connector;

communicating test data between the device under test and the test logic via the connector to test the device under test.

* * * * *